(12) United States Patent
Thottathil et al.

(10) Patent No.: US 11,996,818 B2
(45) Date of Patent: May 28, 2024

(54) DIFFERENTIAL CURRENT-TO-VOLTAGE CONVERSION

(71) Applicant: AMS INTERNATIONAL AG, Jona (CH)

(72) Inventors: Rahul Thottathil, Eindhoven (NL); Ravi Kumar Adusumalli, Eindhoven (NL); Parvathy S. J., Eindhoven (NL); Veeresh Babu Vulligaddala, Eindhoven (NL)

(73) Assignee: ams International AG, Jona (CH)

( * ) Notice: Subject to any disclaimer, the term of this patent is extended or adjusted under 35 U.S.C. 154(b) by 165 days.

(21) Appl. No.: 17/618,439

(22) PCT Filed: Jun. 9, 2020

(86) PCT No.: PCT/EP2020/065996
§ 371 (c)(1),
(2) Date: Dec. 11, 2021

(87) PCT Pub. No.: WO2020/260012
PCT Pub. Date: Dec. 30, 2020

(65) Prior Publication Data
US 2022/0255536 A1     Aug. 11, 2022

Related U.S. Application Data

(60) Provisional application No. 62/868,464, filed on Jun. 28, 2019.

(51) Int. Cl.
*H03M 1/12*     (2006.01)
*H03F 3/45*     (2006.01)
(Continued)

(52) U.S. Cl.
CPC ....... *H03H 19/004* (2013.01); *H03F 3/45475* (2013.01); *H03K 3/012* (2013.01);
(Continued)

(58) Field of Classification Search
CPC .............. H03H 19/004; H03F 3/45475; H03F 2203/45514; H03F 2203/45551;
(Continued)

(56) References Cited

U.S. PATENT DOCUMENTS 9,461,625 B1   10/2016   Prandi
2005/0258901 A1*   11/2005   Khorramabadi .... H03F 3/45188
330/254

(Continued)

OTHER PUBLICATIONS

International Search Report and Written Opinion for corresponding PCT Patent Application No. PCT/EP2020/065996 dated Aug. 27, 2020.

*Primary Examiner* — Jean B Jeanglaude
(74) *Attorney, Agent, or Firm* — Viering, Jentschura & Partner mbB; Samuel Y. Lo

(57) ABSTRACT

An apparatus includes a differential current-to-voltage conversion circuit that includes an input sampling stage circuit, a differential integration and DC signal cancellation stage circuit, and an amplification and accumulator stage circuit. An input common mode voltage of the differential current-to-voltage conversion circuit is independent of an output common mode voltage of the differential current-to-voltage conversion circuit.

9 Claims, 3 Drawing Sheets

(51) Int. Cl.
    *H03H 19/00*     (2006.01)
    *H03K 3/012*     (2006.01)
    *H03K 3/013*     (2006.01)

(52) U.S. Cl.
    CPC ... *H03K 3/013* (2013.01); *H03F 2203/45514* (2013.01); *H03F 2203/45551* (2013.01)

(58) Field of Classification Search
    CPC .............. H03F 3/087; H03F 2200/252; H03F 2200/264; H03F 2200/312; H03F 2200/411; H03F 2200/421; H03F 2200/81; H03F 2203/45134; H03F 2203/45138; H03F 2203/45141; H03F 2203/45171; H03F 2203/45174; H03F 2203/45206; H03F 2203/45512; H03F 2203/45562; H03F 2203/45614; H03F 2203/45616; H03F 2203/45634; H03F 2203/45726; H03F 1/086; H03F 3/005; H03F 3/70; H03F 3/082; H03K 3/012; H03K 3/013
    See application file for complete search history.

(56) References Cited

U.S. PATENT DOCUMENTS

| | | | |
|---|---|---|---|
| 2008/0036536 A1* | 2/2008 | Khorramabadi | H03B 5/1228 330/252 |
| 2011/0163233 A1 | 7/2011 | Ng | |
| 2015/0145801 A1 | 5/2015 | Angelini | |

* cited by examiner

DIFFERENTIAL CURRENT-TO-VOLTAGE CONVERSION

RELATED APPLICATIONS

The present invention is a U.S. National Stage under 35 USC 371 patent application, claiming priority to Serial No. PCT/EP2020/065996, filed on 9 Jun. 2020; which claims priority from U.S. Provisional Patent Application No. 62/868,464 filed 28 Jun. 2019; the entirety of both are incorporated herein by reference.

FIELD OF THE DISCLOSURE

The present disclosure relates to differential current-to-voltage conversion.

BACKGROUND

Various applications in electronic circuits require measuring a relatively small current signal. For example, in the context of optical proximity sensing, a small AC current signal arises from the detection of pulsed AC light signals emitted by a light emitter and reflected from an object to be detected in the presence of larger ambient light DC current signals. The DC currents generated by the light detector that arise from the ambient light often are many times greater than the AC currents generated by the light detector arising from reflected light rays when light emitter is turned on. The large ratio between DC current signal amplitudes and AC current signal amplitudes makes the detection of small AC current signals challenging in the presence of a strong ambient light or DC current signals.

SUMMARY

The present disclosure differential current-to-voltage conversion circuits that can be used in a wide range of applications where it is necessary or desirable to detect a relatively small current.

For example, in one aspect, the present disclosure describes an apparatus that includes a differential current-to-voltage conversion circuit that includes an input sampling stage circuit, a differential integration and DC signal cancellation stage circuit, and an amplification and accumulator stage circuit.

The input sampling stage circuit operable to sample first current signals during a first period and operable to sample second current signals during a second period. The differential integration and DC signal cancellation stage circuit operable to receive the first and second current signals from the input sampling stage circuit, integrate the first and second current signals, and generate a voltage output representative of a difference between the first and second current signals. The amplification and accumulator stage circuit operable to receive the voltage output from the differential integration and DC signal cancellation stage circuit, and amplify the received voltage output. An input common mode voltage of the differential current-to-voltage conversion circuit is independent of an output common mode voltage of the differential current-to-voltage conversion circuit.

Some implementations include one or more of the following features. For example, in some instances, the input common mode voltage of the differential current-to-voltage conversion circuit differs from the output common mode voltage of the differential current-to-voltage conversion circuit. In some implementations, a common mode of the differential integration and DC signal cancellation stage circuit is independent of a common mode of the amplification and accumulator stage circuit. In some cases, the common mode of the differential integration and DC signal cancellation stage circuit differs from the common mode of the amplification and accumulator stage circuit.

In some implementations, the first period is determined in accordance with a first clock signal, and the second period is determined in accordance with a different second clock signal that is offset from the first clock signal such that the first and second periods are non-overlapping. The differential current-to-voltage conversion circuit can be operable to perform reset operations for every clock phase, wherein a clock phase includes a complete cycle for both the first and second clock signals.

In some case, the apparatus further includes a current generating device connected to an input common mode of the differential current-to-voltage conversion circuit. The current generating device can be, for example, a light detector (e.g., a photodiode).

In some implementations, the amplification and accumulator stage circuit is operable to accumulate the receive voltage over a specified number of clock cycles. An output of the amplification and accumulator stage circuit can be coupled, for example, to an analog-to-digital converter.

Some implementations include one or more of the following advantages. For example, the differential current-to-voltage conversion circuit can reduce or eliminate charge induced errors such as charge sharing and clock feedthrough that may be present in single ended proximity architectures. The disclosed circuit can, in some instances, significantly improve the power supply rejection ratio (PSRR) and the common mode rejection ratio (CMRR). The disclosed circuit also can avoid having the feedback capacitor be floating in any of the phases of operation.

Other aspects, features and advantages will be readily apparent from the following detailed description, the accompany drawings, and the claims.

DETAILED DESCRIPTION

In the following paragraphs, a differential current-to-voltage conversion circuit 10 is described in the context of a proximity sensor that includes a light emitter (e.g., a VCSEL or LED) and a light detector (e.g., a photodiode). The differential current-to-voltage conversion circuit 10, however, can be used in other applications, including those where it is desirable to sense relatively small current signals.

Figure 1:
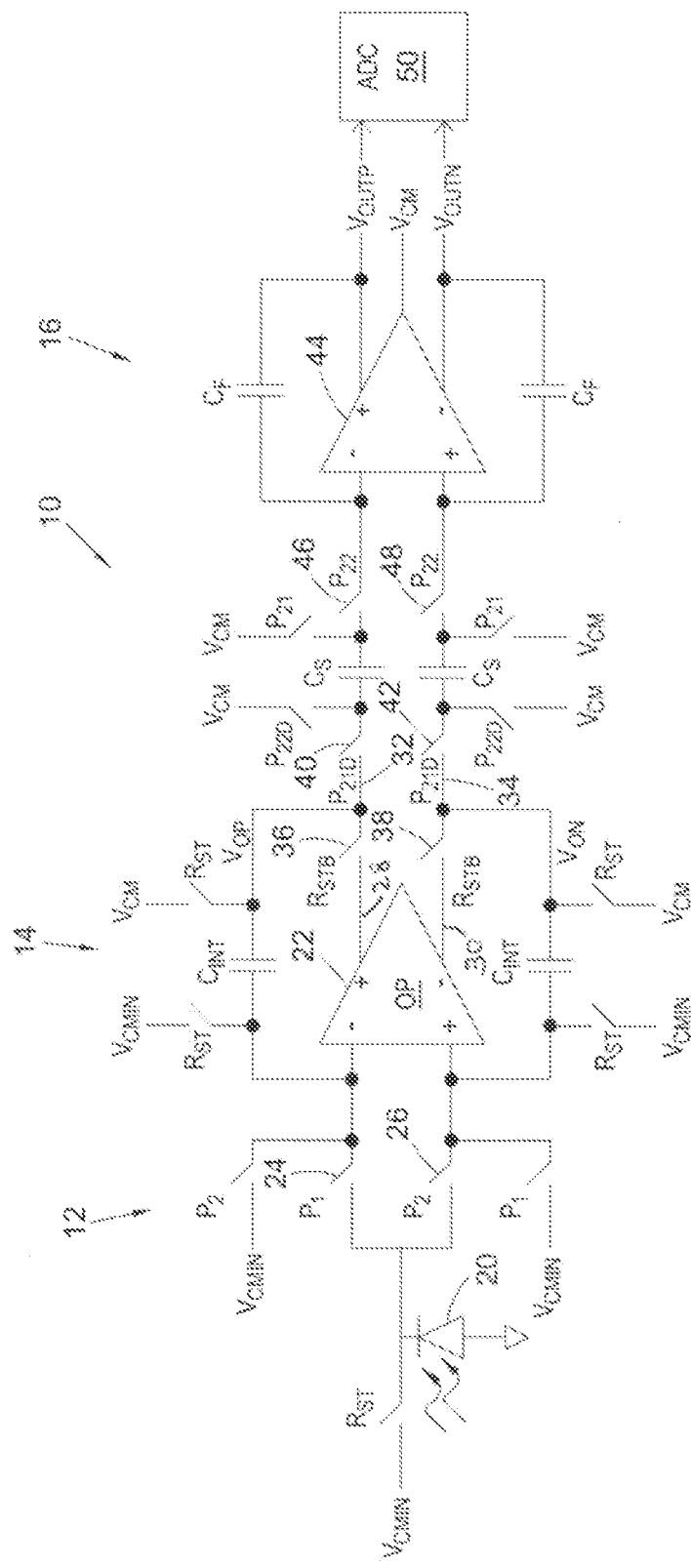
FIG. 1 illustrates an example of differential current-to-voltage conversion circuit.

As shown in FIG. 1, the differential current-to-voltage conversion circuit 10 includes an input sampling stage 12, a differential integration and DC signal cancellation stage 14, and an amplification and accumulator stage 16. The circuit 10 can be fabricated, for example, as an integrated semiconductor circuit using standard digital CMOS design and manufacturing technologies.

The input sampling stage 12 is configured to receive current signals from a current generating device, which, in the illustrated example, is a light detector (e.g., a photodiode) 20 of a proximity sensing module. The input sampling stage 12 includes first and second switches P1, P2 that can be closed, respectively, at specified times so as to connect an output of the light detector 20 to the differential integration and DC signal cancellation stage 14.

The differential integration and DC signal cancellation stage 14 includes a first differential amplifier 22 operable to receive at its first input (e.g., the positive terminal '+') first input signals from the light detector 20 that are representative of the ambient light DC signals during first periods of time (e.g., periods occurring in-between the AC pulses, when the proximity sensor's light emitter is turned off). The first input signals are provided to the first input (+) when switch 24 is open and switch 26 is closed, which in turn corresponds to first periods of time when AC light pulses are not being emitted by the proximity sensor's light emitter, and only DC ambient light signals are being sensed.

The differential amplifier 22 also is operable to receive at its second input (e.g., the negative terminal '−') second input signals representative of a combination of the ambient light DC signals and reflected light AC pulses during second periods of time (e.g., periods when the light emitter is turned on and is emitting AC pulses and when ambient light signals are also being sensed). The second input signals are provided to the second input (−) when switch 24 is closed and switch 26 is open.

The differential integration and DC signal cancellation stage 14 is operable to generate first and second differential analog output signals that are representative, respectively, of the positive and negative integrated reflected light AC pulses. The differential output signals are provided, respectively, on output lines 28, 30 of the differential amplifier 22 and (when switches 36, 38 are closed) on output lines 32, 34 of the differential integration and DC signal cancellation stage 14. The output lines 32, 34 are connected, respectively, back to the negative and positive input terminals of the differential amplifier 22 by way of integration capacitors $C_{INT}$.

Operation of the differential amplifier 22 causes the ambient light DC signals to be canceled such that the ambient light DC signals are not included in the differential output signals appearing on lines 28, 30 and 32, 34. In particular, the differential integration and DC signal cancellation stage 14 is operable to eliminate the average DC current signals integrated over a complete cycle of a clock period during which the proximity sensor's light emitter is switched on and off, while the measured amplitudes of small AC current signals over multiple integration cycles increase until an AC current signal with sufficiently high signal-to-noise ratio is obtained for the particular application (e.g., accurate determination of the distance an object-to-be-detected is from a sensor). The inherent ambient cancellation function of the circuitry obviates the need to provide ambient light signal cancellation circuitry separate and apart from the differential integration circuitry.

When the switches 40, 42 are closed, the outputs of the differential integration and DC signal cancellation stage circuitry 14 are sampled and stored, respectively, by capacitors CS. When switches 46, 48 subsequently are closed, the signals stored by the capacitors CS are transferred, respectively, to the negative ('−') and positive ('+') inputs of a second differential amplifier 44 that forms part of the amplification and accumulator stage circuitry 16. The outputs of the differential amplifier 44 are connected, respectively, back to the negative and positive input terminals of the differential amplifier 44 by way of feedback capacitors CF.

The input common mode voltage (VCMIN) of the differential current-to-voltage conversion circuit 10 is independent of, and thus can differ from, the output common mode voltage (VCM). Likewise, the common mode of the differential integration and DC signal cancellation stage 14 can be independent of, and thus differ from, the common mode of the amplification and accumulator stage circuitry 16. For example, VCM may be at least twice as large as VCMIN, and in some cases, it can be more than five times as large as VCMIN. As an example, VCMIN may be 100 mV, whereas VCM may be 900 mV.

Figure 2:
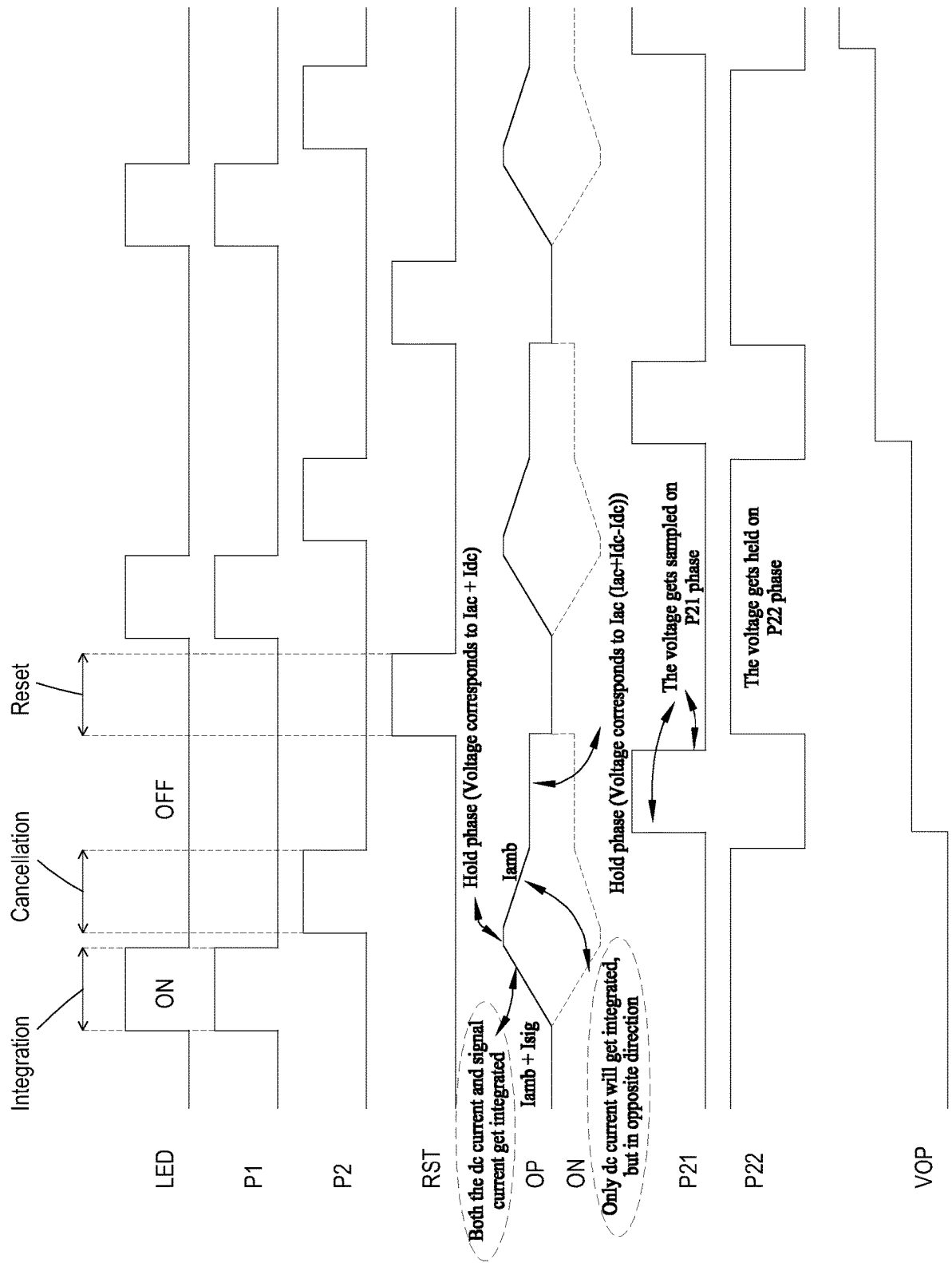
FIG. 2 is a timing diagram associated with the circuit of FIG. 1.

The following clock and reset signals trigger opening/closing of the various switches as shown in FIG. 1: $P_1$, $P_2$, $P_{21}$, $P_{22}$, $P_{21D}$, $P_{22D}$, $R_{ST}$ and $R_{STB}$. Examples of the clock signals $P_1$, $P_2$, $P_{21}$, $P_{22}$ and the reset signal $R_{ST}$ are illustrated in FIG. 2. Further, the clock signal $P_{21D}$ is a delayed version (e.g., by several nanoseconds) of the clock signal $P_{21}$; likewise, the clock signal $P_{22D}$ is a delayed version (e.g., by several nanoseconds) of the clock signal $P_{22}$. Reset signal $R_{STB}$ is the inverse of the reset signal $R_{ST}$.

An example operation of the differential current-to-voltage conversion circuit 10 is described in the following paragraphs in the context of differential proximity sensing. In an integration phase, the proximity sensor's light emitter is ON, and the light detector 20 receives and senses optical signals reflected, for example, by an object-of-interest. During the integration phase, the light detector 20 is connected to the negative terminal of the differential amplifier 22. As indicated by FIG. 2, during the integration phase, the clock signal P1 is ON (i.e., a digital high signal so that the associated switches are closed), the clock signal P2 is OFF (i.e., a digital low signal so that the associated switches are open), and the reset signal RST is OFF (i.e., a digital low signal so that the associated switches are open). During this phase, an output voltage equivalent to the sum of the current (Iac) generated by the reflected light and the ambient current (Idc) is integrated on to one of the integration capacitors $C_{INT}$, and thus the voltage at the output of the differential amplifier 22 also increases from the output common mode ($V_{CM}$) until the clock signal P1 goes low. The output will hold that value until the clock signal P2 goes high. The hold phase is equal to the non-overlap time between the clock signals P1 and P2.

In a cancellation phase, the proximity sensor's light emitter is OFF, and the light detector 20 is connected to the positive terminal of the differential amplifier 22. During this cancellation phase, the clock signal P1 is OFF, the clock signal P2 is ON, and the reset signal RST is OFF. The corresponding output voltage is equivalent to the ambient signal (Idc) only. The voltage corresponding to the ambient current (−Idc) is integrated onto one of the integration capacitors $C_{INT}$. This current (−Idc) moves in the direction opposite that of the sum of Iac+Idc (i.e., a negative slope). Thus, at the end of cancellation phase, the output voltage is equivalent to the current (Iac) generated by the reflected light only. This voltage then is held for sampling by the second stage where amplification takes place. In particular, the output holds this voltage value until the reset signal RST goes high. Here, the hold phase is equal to the non-overlap time between the clock signal P2 and the reset signal RST.

During the reset phase, the proximity sensor's light emitter is OFF, the clock signals P1 and P2 are OFF, and the rest signal $R_{ST}$ is ON. The rest signal $R_{ST}$ (and $R_{STB}$) is used to reset the integration capacitors $C_{INT}$ to a known potential, as well as to reset the first stage output to the output common mode voltage $V_{CM}$. During this phase, the differential amplifier 22 is in an open loop.

After the integration and cancellation phases, but prior to the reset phase, the clock signal P21 is used to sample the signals at the output of the differential integration and DC signal cancellation stage 14. The clock signal P22 is used to transfer the stored charge to the output of the amplification and accumulator stage 16 (with an amplification (Cs/Cf)). As noted above, the amplification and accumulator stage 16 is configured such that it will hold the voltage at the feedback capacitor $C_F$, and the voltage corresponding to the signal current (Iac) is accumulated over N clock cycles to a particular level depending on the required settings. The analog voltage outputs by the amplification and accumulator stage 16 can be sampled and converted to corresponding digital codes by the ADC 50.

In the illustrated circuit of FIGS. 1 and 2, a reset operation is performed for every clock phase (i.e., where a clock phase includes a complete cycle in which both clock signals P1 and P2 go high), which can reduce the complexity of the current-to-voltage amplifier and also can support a high value for N (i.e., fewer restrictions for swing and saturation values). As there is a reset signal at every clock phase, the circuit can handle a relatively high ambient light condition. Further, in the illustrated example, the photodiode 20 is connected to the input common mode (i.e., a finite potential), which can prevent charging of the diode capacitor such that it does not impact the output when the photodiode connects back to the input terminals of the differential amplifier 22 during the P1 and P2 clock phase. Thus, the photodiode 20 is not a floating node during any phase of operation.

Figure 3:
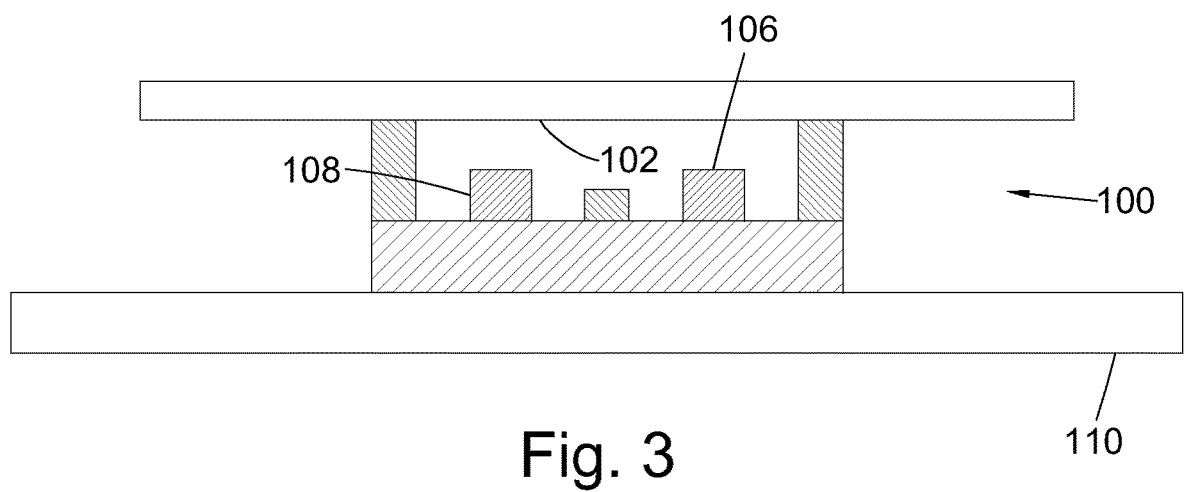
FIG. 3 is a block diagram showing an example of an optoelectronic module in which the circuit of FIG. 1 can be incorporated.

FIG. 3 illustrates an example of an optoelectronic module 100 that includes a light emission channel and a light detection channel. A light emitter 106 and a light receiver 108 can be housed within a package that is mounted, for example, on a printed circuit board (PCB) or other substrate 110 for a host device in which the module 100 is disposed. The light emitter 106 is operable to emit light at a particular wavelength or range of wavelengths. In some implementations, the light emitter 106 is implemented as one or more laser diodes or vertical cavity surface emitting lasers (VCSELs). Light from the emitter 106 is directed out of the module 100 through a cover glass 102 and, if reflected by an object outside of the module back toward the module's detection channel, can be sensed by the light receiver 108, which includes a light detector (e.g., photodiode) operable to generate a current in response to detected light signals, and also includes a differential current-to-voltage conversion circuit 10 and ADC 50. The differential current-to-voltage conversion circuit 10 and ADC 50 may reside in the same semiconductor chip as the light detector 20 or in one or more other semiconductor chips. In some instances, the differential current-to-voltage conversion circuit 10 and ADC 50 may be external to the module 100; for example, they can be mounted on the PCB or other substrate 110 for the host device in which the module 100 is disposed.

Although the circuits described above are particularly useful in the context of proximity sensing, they also can be used for other applications in which it is necessary or desirable to detect relatively small currents. Further, although the illustrated example shows both inputs of the input sampling stage 12 arranged to receive a signal from the same light detector 20, in some implementations, a first one of the inputs is arranged to receive a signal from a first current generating device (e.g., a first light detector), whereas the second one of the inputs is arranged to receive a signal from a second current generating device (e.g., a second light detector).

Various modifications within the spirit of the present disclosure will be apparent and can be made to the examples described in detail above. Accordingly, other implementations are within the scope of the claims.

The invention claimed is:

1. An apparatus comprising a differential current-to-voltage conversion circuit including:
    an input sampling stage circuit operable to sample first current signals during a first period and operable to sample second current signals during a second period;
    a differential integration and DC signal cancellation stage circuit operable to:
        receive the first and second current signals from the input sampling stage circuit;
        integrate the first and second current signals; and
        generate a voltage output representative of a difference between the first and second current signals; and
    an amplification and accumulator stage circuit operable to:
        receive the voltage output from the differential integration and DC signal cancellation stage circuit; and
        amplify the received voltage output,
    wherein an input common mode voltage of the differential current-to-voltage conversion circuit is independent of an output common mode voltage of the differential current-to-voltage conversion circuit; and
    wherein the input common mode voltage of the differential current-to-voltage conversion circuit differs from the output common mode voltage of the differential current-to-voltage conversion circuit.

2. The apparatus of claim 1 wherein an output of the amplification and accumulator stage circuit is coupled to an analog-to-digital converter.

3. The apparatus of claim 1 wherein a common mode of the differential integration and DC signal cancellation stage circuit is independent of a common mode of the amplification and accumulator stage circuit.

4. The apparatus of claim 3 wherein the common mode of the differential integration and DC signal cancellation stage circuit differs from the common mode of the amplification and accumulator stage circuit.

5. The apparatus of claim 1 wherein the first period is determined in accordance with a first clock signal, and the second period is determined in accordance with a different second clock signal that is offset from the first clock signal such that the first and second periods are non-overlapping, wherein the differential current-to-voltage conversion circuit is operable to perform reset operations for every clock phase, wherein a clock phase includes a complete cycle for both the first and second clock signals.

6. The apparatus of claim 1, further including a current generating device connected to an input common mode of the differential current-to-voltage conversion circuit.

7. The apparatus of claim 6 wherein the current generating device is a light detector.

8. The apparatus of claim 6 wherein the current generating device is a photodiode.

9. The apparatus of claim 1 wherein the amplification and accumulator stage circuit is further operable to accumulate the receive voltage over a specified number of clock cycles.

* * * * *